US006656833B2

(12) United States Patent
Isogai (10) Patent No.: US 6,656,833 B2
(45) Date of Patent: Dec. 2, 2003

(54) METHOD OF DRAM (75) Inventor: Satoru Isogai, Tokyo (JP)

(73) Assignees: NEC Corporation (JP); NEC Electronics Corp (JP)

( * ) Notice: Subject to any disclaimer, the term of this patent is extended or adjusted under 35 U.S.C. 154(b) by 0 days.

(21) Appl. No.: 09/842,944

(22) Filed: Apr. 26, 2001

(65) Prior Publication Data

US 2001/0035547 A1 Nov. 1, 2001

(30) Foreign Application Priority Data

Apr. 27, 2000 (JP) .......................................... 2000-127433

(51) Int. Cl.$^7$ ........................................... H01L 21/4763
(52) U.S. Cl. ........................ 438/629; 438/620; 438/637
(58) Field of Search ................................ 438/620, 629, 438/637

(56) References Cited

FOREIGN PATENT DOCUMENTS

JP          02001135723 A  * 11/1999

* cited by examiner

*Primary Examiner*—Long Pham
(74) *Attorney, Agent, or Firm*—Dickstein, Shapiro, Morin & Oshinsky, LLP.

(57) ABSTRACT

A semiconductor device is fabricated by forming a first insulating layer, in which an etch stopper and a first contact plug are formed so that the etch stopper surrounds an end portion of the first contact plug and the latter extends through the first insulating layer across its opposite surfaces. On the first insulating layer is formed a second insulating layer which is selectively etched to form a throughhole extending downwards to the end portion of the first contact plug. A second contact plug is formed in the throughhole to establish a direct electrical connection with the first contact plug. Due to the presence of the etch stopper, the throughhole can be aligned with an increased margin of tolerances.

4 Claims, 6 Drawing Sheets

METHOD OF DRAM

BACKGROUND OF THE INVENTION

1. Field of the Invention

The present invention relates generally to semiconductor devices, and more specifically to a method of fabricating a semiconductor device in which lower and upper contact plugs are aligned with each other and directly connected.

2. Description of the Related Art

Dynamic random access memories are used in many applications because of their space savings feature. This is achieved by their memory cells requiring only one capacitor for holding a single bit of information and one transistor as a switching gate for read/write operation. Recent technology for dynamic random access memories is toward further reducing the space of their capacitor by fabricating it in a layered structure, known as stacked capacitors. The stacked capacitors are of two types, the fin type and the cylinder type. Stacked capacitors of the cylinder type are particularly suited for memories of 4 megabits or more that are integrated in LSI chips. Due to their cylindrical structures, memories of desired capacitance can be obtained simply by increasing their vertical dimension. However, this results in an increased thickness of insulation between upper and lower layers which must be interconnected, and hence a lengthened inter-layer connection. To form an inter-layer connection, one approach is to etch a one-length hole through the insulation and fill the hole with a contact plug. This technique requires a long time to provide etching through the full length of insulation. If an intermediate layer is additionally provided between the upper and lower layers and a throughhole must be etched to the intermediate layer concurrently with the etching of the interconnection throughhole, over-etching occurs on the intermediate layer. To avoid this problem, it is the usual practice to use two contact plugs, one on the intermediate layer and the other beneath it and connect these plugs via the intermediate layer.

However, the use of the intermediate layer as an intermediary contact point between upper and lower layers often results in an increase in total length of the interconnection and hence an increase in resistance and in propagation delay. This is undesirable where high speed operation is important. Although this problem may be eliminated by vertically aligning upper and lower contact plugs and connecting them together with via an intermediate layer, it is still necessary to provide a sufficient space for purposes of insulation between such an intermediate layer and other intermediate layers.

In addition, there is still a need to create a direct interconnection between the upper and lower layer for purposes of large scale integration and high speed operation. Direct interconnection requires precision alignment of the upper contact plug with the lower contact plug. If misalignment occurs during the etching process of the upper insulation layer to create a hole above the lower contact plug, voids can occur around the upper edges of the lower contact plug due to different rates at which the lower insulation layer and the lower contact plug are tended to be etched after the hole has reached the upper end of the lower contact plug because of the need to provide over-etching of an intermediate wiring (aluminum) layer concurrently performed with the etching of the upper insulation layer. This is particularly true due to the large difference between the etch rate of insulating material and that of aluminum. The occurrence of such voids is problematic. When the upper contact hole is metallized, waste products are trapped in the voids and act as a potential source of erosion or separation of contact plugs. If the lower insulation layer is excessively etched during the formation of a misaligned upper contact hole, a void would occur that extends down to a substantial depth in the lower insulating layer and the material entrapped in such a void would create a short-circuit with an adjacent conductive layer.

SUMMARY OF THE INVENTION

It is therefore an object of the present invention to provide a method of fabricating a semiconductor device free from voids which would otherwise occur when an upper contact hole is formed on a lower contact plug.

According to a first aspect of the present invention, there is provided a method of fabricating a semiconductor device, comprising the steps of forming a first insulating layer, forming an etch stopper and a first contact plug in the first insulating layer so that the etch stopper surrounds an end portion of the first contact plug, the first contact plug extending through the first insulating layer between opposite surfaces thereof, forming a second insulating layer on the first insulating layer, selectively etching the second insulating layer to form a throughhole extending to the end portion of the first contact plug, and forming a second contact plug in the throughhole.

According to a second aspect, the present invention provides a method of fabricating a semiconductor device, comprising the steps of forming a first insulating layer, forming a first contact plug in the first insulating layer, etching the first insulating layer until an end portion of the first contact plug is exposed to the outside, forming an etch stop layer on the first insulating layer so that the exposed portion of the first contact plug is embedded in the etch stop layer, anisotropically etching the etch stop layer so that a portion of the etch stop layer which surrounds the end portion of the first contact plug remains and the first insulating layer is exposed to the outside, forming a second insulating layer on the exposed first insulating layer so that the end portion of the first contact plug and the surrounding etch stop layer portion are embedded in the second insulating layer, polishing the second insulating layer until the end portion of the first contact plug, the surrounding portion of the etch stop layer and the second insulating layer present a flattened surface and the surrounding portion of the etch stop layer attains a desired width, forming a third insulating layer on the flattened surface, selectively etching the third layer to form a throughhole extending to the first contact plug, and forming a second contact plug in the throughhole.

According to a third aspect, the present invention provides a method of fabricating a semiconductor device, comprising the steps of forming a first insulating layer, forming an etch stop layer in the first layer, selectively etching an inner portion of the etch stop layer to form a throughhole in the first insulating layer so that an outer portion of the etch stop layer remains and surrounds an end portion of the throughhole, forming a first contact plug in the throughhole, polishing the first insulating layer until an end portion of the first contact plug, the outer portion of the etch stop layer and the first insulating layer form a flattened surface, forming a second insulating layer on the flattened surface, selectively etching the second insulating layer to form a throughhole extending to the first contact plug, and forming a second contact plug in the throughhole.

According to a third aspect, the present invention provides a semiconductor device comprising a lower insulating layer, a first contact plug extending across opposite surfaces of the lower insulating layer, an etch stopper surrounding an end portion of the first contact plug, an upper insulating layer on the lower insulating layer, and a second contact plug in the upper insulating layer, the second contact plug extending from the end portion of the first contact plug to an upper surface of the upper insulating layer.

According to a fourth aspect, the present invention provides a semiconductor memory device comprising peripheral circuitry formed on a first area of a substrate and an array of memory cells formed on a second area of the substrate. The peripheral circuitry comprises a lower insulating layer on the substrate, an upper insulating layer on the lower insulating layer, a wiring layer on the upper insulating layer, and a lower contact plug in the lower insulating layer extending from the substrate to the upper insulating layer, an etch stopper in the lower insulating layer, the etch stopper surrounding an end portion of the lower contact plug adjacent to the upper insulating layer, and an upper contact plug in the upper insulating layer for establishing electrical connection between the lower contact plug and the wiring layer. Each of the memory cells comprises a capacitor for holding a binary digit and a switching transistor for coupling the capacitor to the peripheral circuitry.

BRIEF DESCRIPTION OF THE DRAWINGS

The present invention will be described in detail further with reference to the following drawings, in which.

DETAILED DESCRIPTION

Figure 1A:
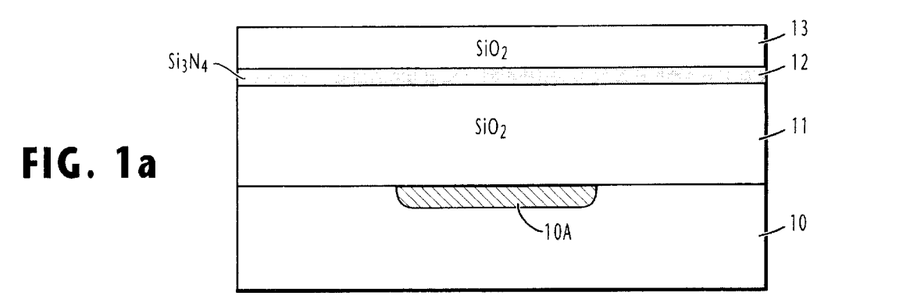
FIGS. 1a to 1i are cross-sectional views of a semiconductor device illustrating successive stages of fabrication according to a first embodiment of the present invention.

A process of forming contact plugs according to a first embodiment of the present invention is shown in FIGS. 1a to 1.

As shown in FIG. 1a, a lower wiring layer 10A is formed by diffusion on a silicon substrate 10, and a silicon dioxide (SiO$_2$) layer 11 is deposited entirely over the upper surface if the substrate, using a CVD (chemical vapor deposition) method. On the silicon dioxide layer 11 is a thin layer 12 of silicon nitride (Si$_3$N$_4$) on which is deposited a silicon dioxide layer 13. Silicon nitride layer 12 is 0.02 to 0.03 $\mu$m thick and the total thickness of layers 11, 12 and 13 is approximately 2 $\mu$m.

Figure 1B:
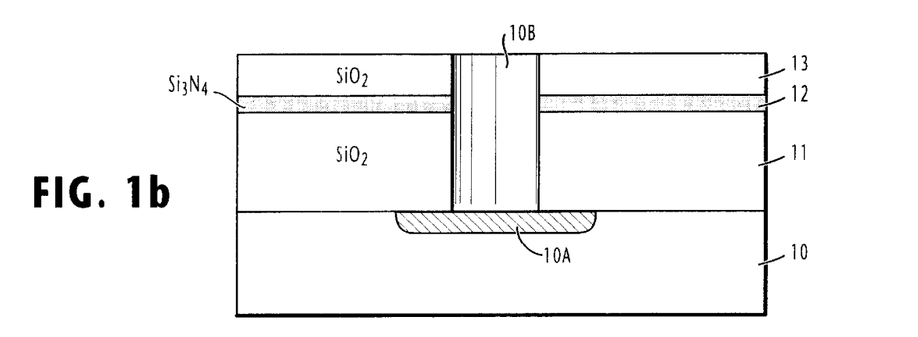

Silicon dioxide layer 13 is then covered with a photoresist mask, not shown, and the layers 13, 12 and 11 are successively etched down to the lower wiring layer 10A to form a cylindrical throughhole or lower contact hole 10B with a diameter of 0.25 $\mu$m (FIG. 1b).

Figure 1C:
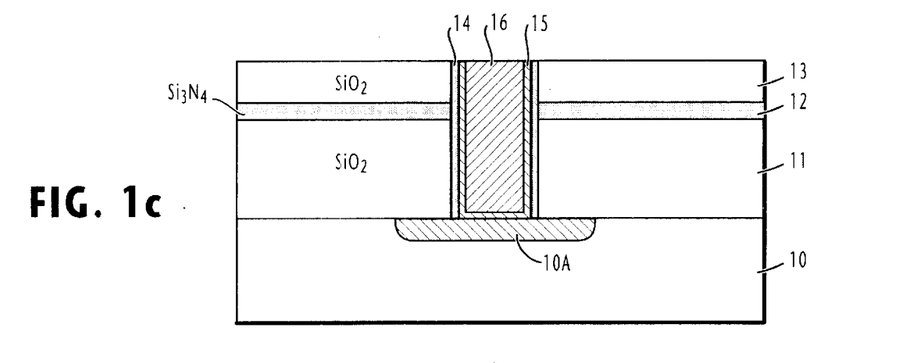

In FIG. 1c, the wafer is subjected to a CVD process whereby the inner sidewalls and the bottom of the hole 10B are coated with a 0.02 to 0.04 $\mu$m thick silicon nitride film and the material deposited on the bottom is removed, leaving a silicon nitride film 14 on the sidewalls. The effect of this sidewall film 14 is to secure sufficient insulation from wiring layers which may possibly exist in the neighborhood of the throughhole 10B. A barrier layer 15 is then deposited in the hole to a thickness of 0.05 to 0.1 $\mu$m using the CVD or sputtering method. Suitable material for the barrier layer 15 is titanium nitride (TiN) because of its high intimacy, its low resistivity and excellent film forming characteristic with respect to the lower wiring layer 10A. In a CVD process, tungsten is deposited in the hole by placing the wafer in a WF$_6$ gas environment and then subjecting the wafer to a reduction process in which SiH$_4$ or H$_2$ gas is heated at an elevated temperature of 400° C. The upper surface Of the silicon dioxide layer 13 is polished to remove undesirable deposited materials using a method, known as chemical mechanical polishing (CMP). In this way, a lower contact plug 16 of cylindrical structure is formed on the lower wiring layer 10A.

Figure 1D:
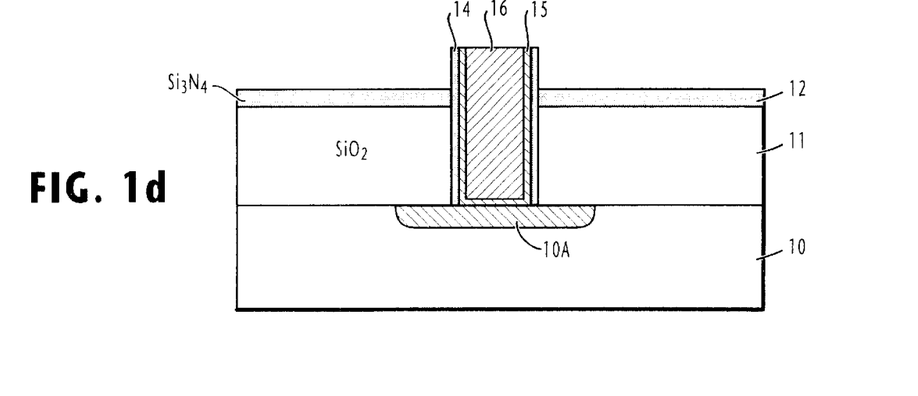

Silicon dioxide layer 13 is then removed by using wet etching to expose the silicon nitride layer 12 to the outside so that an upper portion of the lower contact plug extends above the silicon dioxide layer 13 as shown in FIG. 1d.

Figure 1E:
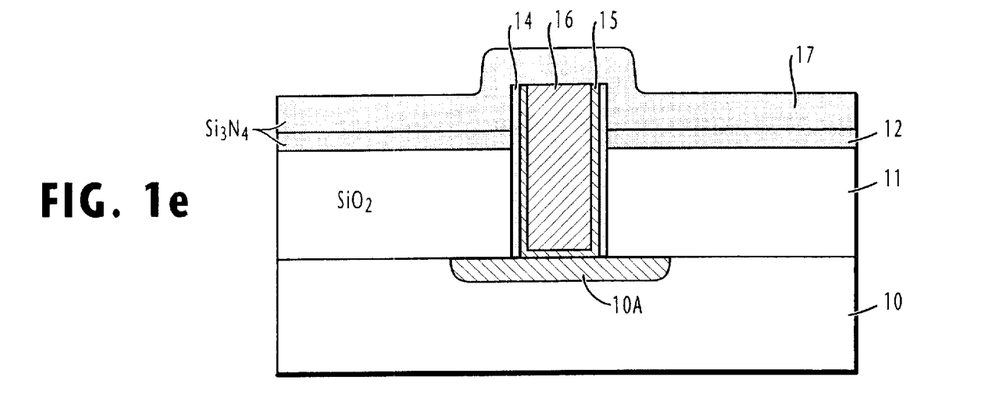

A 0.05-$\mu$m thick silicon nitride layer 17 is formed on the wafer using the CVD method so that the upper extending portion of the lower contact plug is embedded in the silicon nitride lay 17, as shown in FIG. 1e.

Figure 1F:
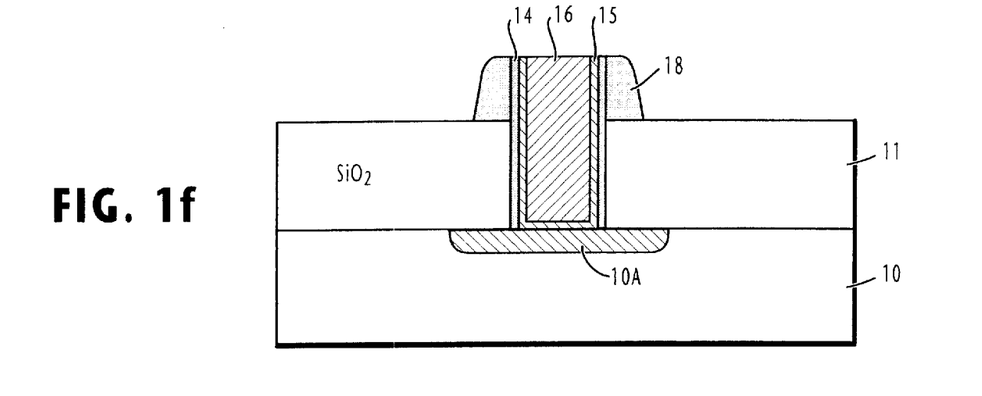

Silicon nitride layers 17 and 12 are anisotropically etched down to the silicon dioxide layer 11. As a result, the silicon nitride deposited around the sidewalls of the upper portion of the lower content plug is left in the shape of a ring 18 as shown in FIG. 1f. This ring serves as an etch stopper during subsequent process steps to protect the immediate outer area of the lower contact plug from etchant.

Figure 1G:
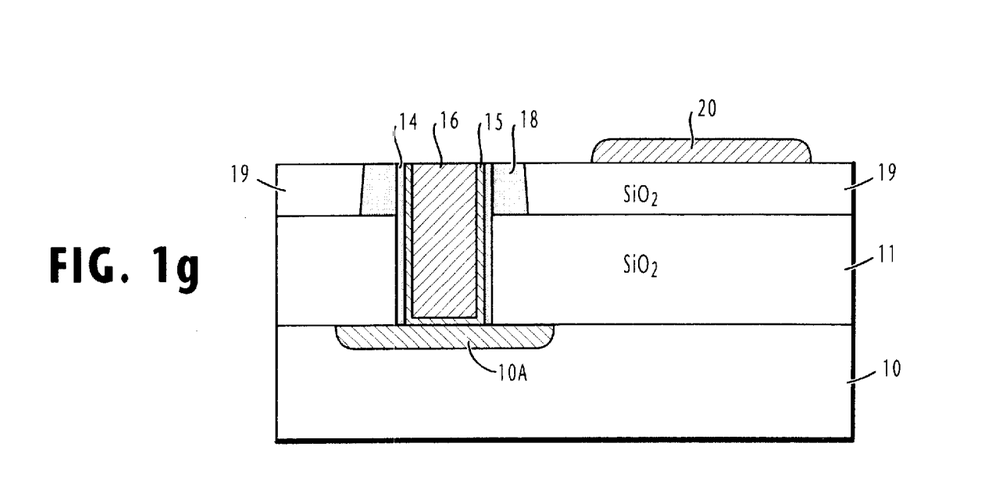

In FIG. 1g, a layer 19 of silicon dioxide is then grown on the wafer and a CMP method is used to polish its upper surface until the width of the ring 18 equals 0.05 $\mu$m. Silicon dioxide layers 11 and 19 form a lower insulating layer on which an intermediate wiring layer 20 is formed with TiN, Al and W.

Figure 1H:
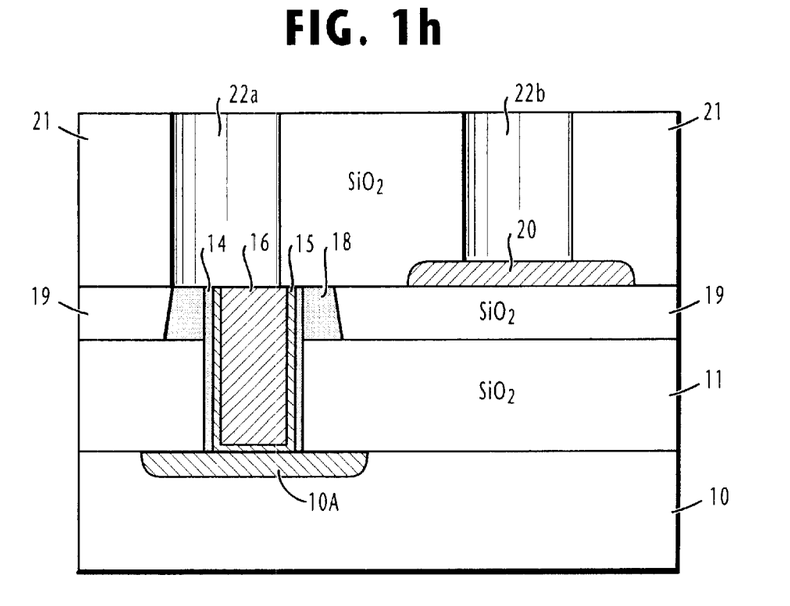

In FIG. 1h, a silicon dioxide layer 21 is grown on the lower insulating layer. This silicon dioxide layer, which serves as an upper insulating layer, is selectively etched using a photomask to form throughhole 22a and 22b each with a diameter of 0.25 $\mu$m down to the lower contact plug and the intermediate wiring layer 20, respectively.

Figure 1I:
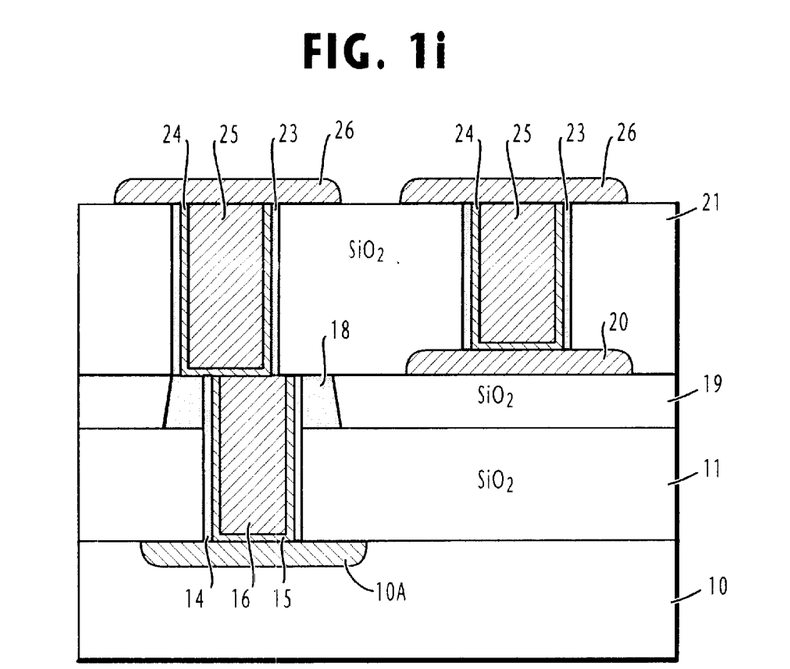

In FIG. 1i, a process similar to that described in connection with FIG. 1c is performed. As a result, the inner sidewalls of each throughhole 22 are coated with a 0.02 to 0.04 $\mu$m thick silicon nitride film 23 to secure insulation from adjacent wiring layers. The sidewalls of the coat 23 are coated with a 0.05 to 0.1 $\mu$m thick barrier layer 24 and the holes are filled with tungsten. The upper surface of the silicon dioxide layer 21 is polished to remove undesirable deposited materials. In this way, an upper contact plug 25 is formed on the lower contact plug 16 and a similar contact plug is formed on the intermediate wiring layer 20. Upper wiring layers 26 are formed on the upper contact plugs 25.

It is seen that the etch stopper 18 effectively enlarges the upper surface area of the lower contact plug and provides an extra allowance to alignment between upper and lower contact plugs. Since this enlarged area presents a hard-to-etch surface to the etchant used in forming the throughhole 22a similar to the surface the wiring layer 20 presents to the same etchant used in forming the throughhole 22b. If the upper contact hole 22a is misaligned with the lower contact plug, such a misalignment is allowed if the hole 22a is within the circumference of the etch stopper. Therefore, no over-etching occurs on the lower insulating layer as long as the offset of hole 22a from the center axis of lower contact plug is smaller than the ring-width of etch stopper 18. Therefore, the present invention prevents the occurrence of voids, which would otherwise occur when upper and Lower contact plugs were to be directly engaged with each other. Hence, short-circuit between the contact plugs and adjacent wiring layers is prevented.

Figure 2:
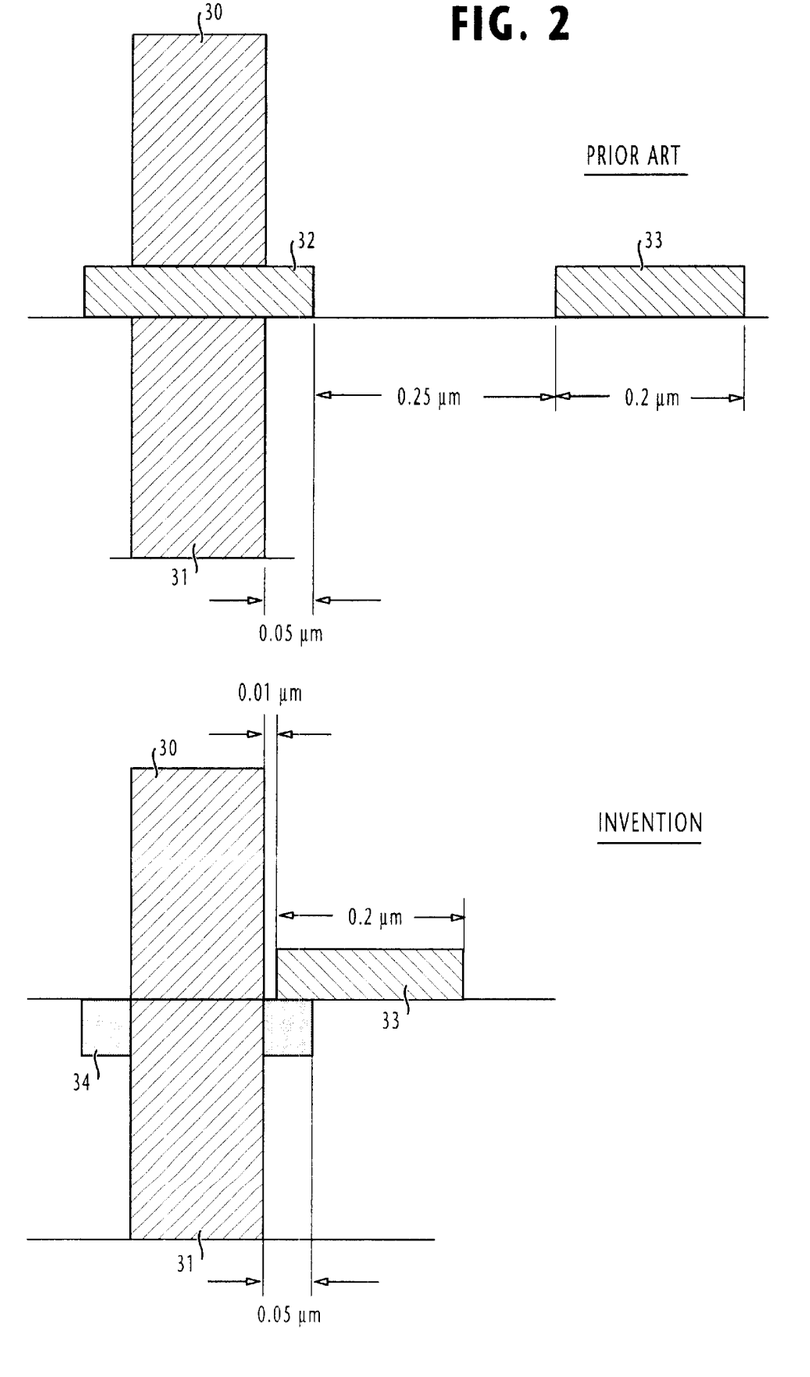
FIG. 2 is cross-sectional views of semiconductor devices fabricated according to a prior art technique and the present invention for purposes of comparison.

In addition, the present invention compares favorably with the prior art technique in which the upper and lower contact plugs are coupled via an intermediate wiring layer. For comparison FIG. 2 shows the prior art technique and the present invention. Assume that upper and lower contact plugs 30 and 31 are coupled together via a first intermediate wiring layer 32 and that a second intermediate wiring layer 33 having a width of 0.2 $\mu$m is provided at a spacing of 0.25 $\mu$m from the first wiring layer 32. In such instances, an offset tolerance of only 0.05 $\mu$m is usually allowed for possible misalignment of the upper contact plug 30 with the wiring layer 32 and the second wiring layer 33 must be spaced a distance of 0.3 $\mu$m from the lower contact plug 31. If the etch stopper 34 of the present invention has a ring-width of 0.05 $\mu$m corresponding to the tolerance margin of the intermediate layer 32, the adjacent intermediate wiring layer 33 can be placed as close as 0.01 $\mu$m to the upper contact plug 30.

An additional feature of the present invention is that since the etch stopper 18 is polished in a chemical mechanical polishing process, no sharp edges are left on the throughhole as an obstacle for undesirable waste products when the throughhole is rinsed.

While mention has been made of silicon nitride as a material of the etch stopper, other materials such as polysilicon or tungsten could equally be as well used. The use of conductive material for the etch stopper is advantageous since the misalignment between the upper and lower contact plugs produces no substantial change in contact resistance.

Figure 3A:
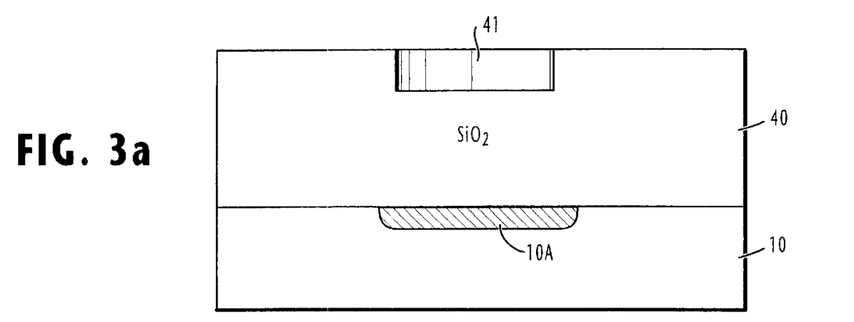
FIGS. 3a to 3e are cross-sectional views of a semiconductor device illustrating successive stages of fabrication according to a second embodiment of the present invention.

The fabrication process of the present invention can be simplified as shown in FIGS. 3a to 3e in which parts corresponding to those of the previous embodiment are marked with the same numerals. A lower insulating layer 40 is formed on the silicon substrate 10 by depositing silicon dioxide to a thickness of 2 $\mu$m using the CVD method (FIG. 3a). Using a photomask, not shown, the silicon dioxide layer 40 is selectively etched to a depth of 0.05 to 0.06 $\mu$m to form a recess 41 with a diameter of 0.35 $\mu$m.

Figure 3B:
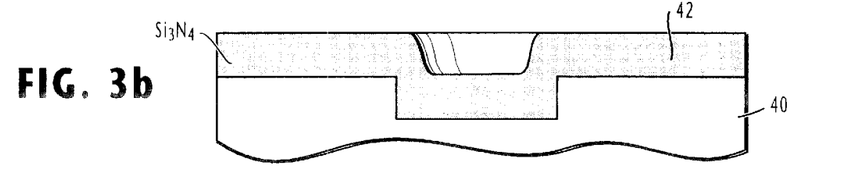
Figure 3C:
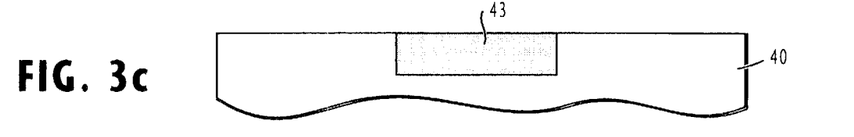

As shown in FIG. 3b, silicon nitride is deposited on the silicon dioxide layer 40 to a thickness of 0.05 to 0.06 $\mu$m to form an $Si_3N_4$ layer 42. Thus, the recess 41 is filled to the brim with silicon nitride. In a CMP process, the silicon nitride layer 42 is removed until the underlying silicon dioxide layer 40 is exposed, thus leaving the silicon nitride in the recess 41 as an etch stop layer 43 as shown in FIG. 3c.

Figure 3D:
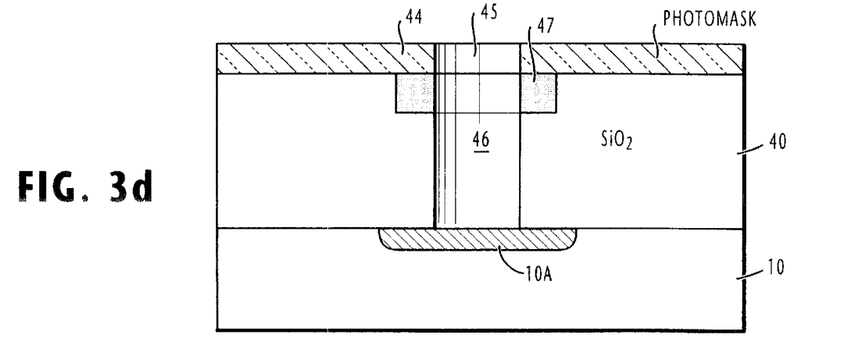

In FIG. 3d, photoresist is deposited on the polished surface of the wafer and patterned to form a photomask 44 with an opening 45 through which the etch stop layer 42 and the silicon dioxide layer 40 are successively etched to the lower wiring layer 10A. A contact hole 46 with a diameter of 0.25 $\mu$m is formed on the lower wiring layer 10A and the etch stop layer is shaped into a ring 47 around the upper portion of the throughhole 46.

Figure 3E:
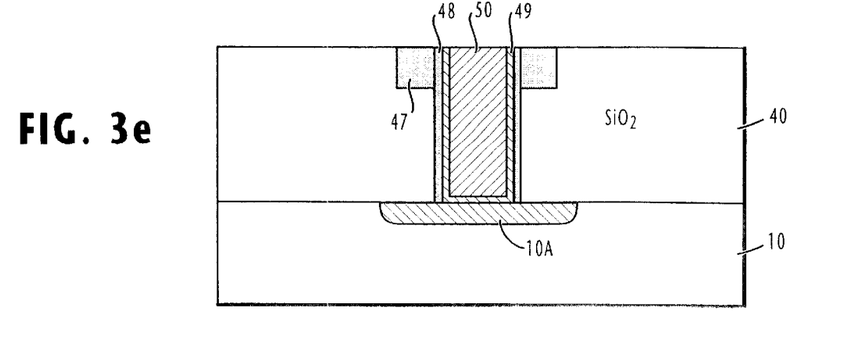

As shown in FIG. 3e, the photomask is removed and a lower contact plug is formed in the throughhole 46 in a process similar to those described above. Specifically, the inner sidewalls of the contact hole 46 are coated with a 0.02 to 0.04 $\mu$m thick silicon nitride film 48 to secure insulation from adjacent wiring layers. The sidewalls of the sidewall layer 48 are coated with a 0.05 to 0.1 $\mu$m thick TiN barrier layer 49 and the hole is filled with tungsten 50. Finally, the upper surface of the silicon dioxide layer 40 is polished.

In the previous embodiments, the etch stopper is confined within a limited range from the lower contact plug. The reason for this is that the semiconductor device is finally subjected to a hydrogen annealing process to diffuse hydrogen molecules down to its substrate and the reduction of hydrogen is utilized to annihilate undesirable dangling bonds produced by plasma etching and ion implantation. Since the hydrogen molecules are not obstructed by the etch stopper during the annealing process, the undesirable products can be completely eliminated.

Figure 4:
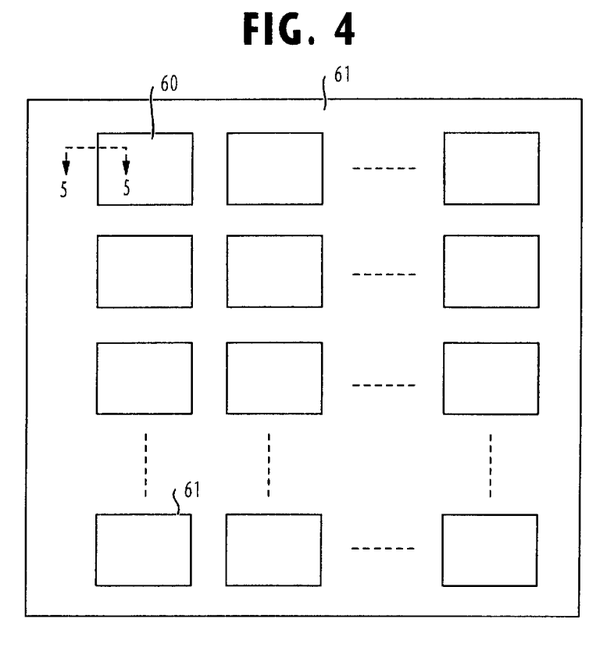
FIG. 4 is a plan view of a semiconductor memory device of the present invention.
Figure 5:
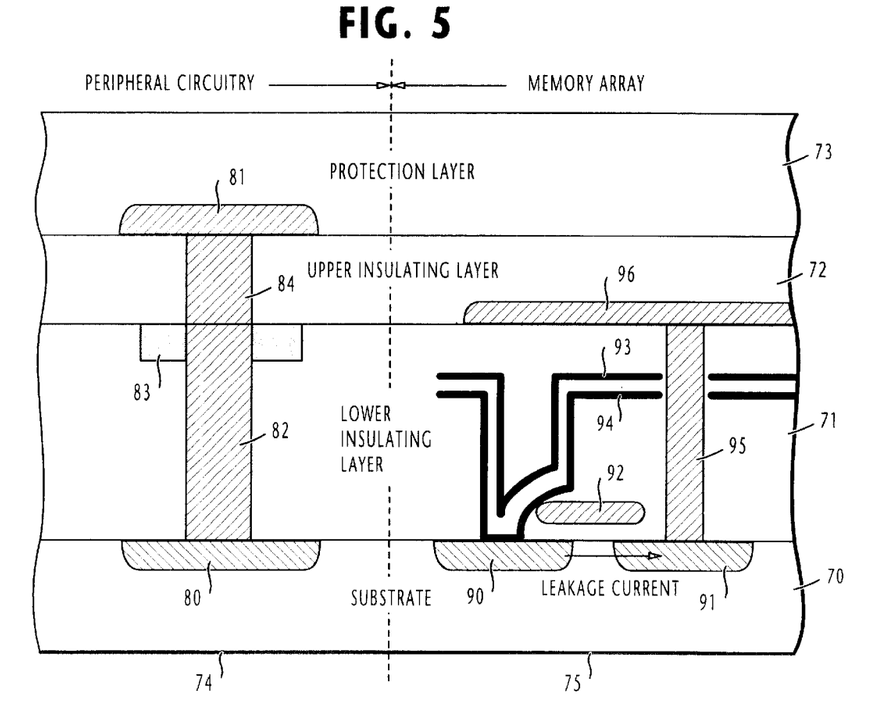
FIG. 5 is a cross-sectional view taken along the line 5—5 of FIG. 4.

FIGS. 4 and 5 show a dynamic random access memory of the present invention. As shown in FIG. 4, the memory includes an array of memory cells 60 and a peripheral circuit 61. Each memory cell 60 is composed of a capacitor for holding a binary digit and a transistor for coupling the capacitor to the peripheral circuit 61.

As shown in FIG. 5, the memory device is fabricated in a laminated structure composed of a silicon substrate 70, a lower insulating layer 71, an upper insulating layer 72 and a protection layer 73. The peripheral circuit is formed on a first area 74 of the device and the memory array is formed on a second area 75. Peripheral circuit is comprised of a diffused region 80 on the silicon substrate 70 and a wiring layer 81 in the protection layer 73 for power lines for supplying power to the memory array. Diffused region 80 and the wiring layer 81 are interconnected by a lower contact plug 82 and an upper contact plug 84 respectively formed in the lower and upper insulating layers 71 and 72. A silicon nitride etch stopper 83 surrounds the upper end portion of the lower contact plug 82.

In the memory array, diffused regions 90 and 91 are provided in the substrate 70. A gate electrode 92 is formed in the lower insulating layer, the electrode 92 being connected to a word line, not shown. Upper and lower electrodes 93 and 94 are provided in the lower insulating layer 71 to constitute a capacitor. Lower electrode 94 is connected to the diffused region 90. A contact plug 95 is formed in the lower insulating layer 71 for coupling the diffused region 91 to an intermediate wiring layer 96 formed in the upper insulating layer 72.

When the memory device is hydrogen-annealed, hydrogen molecules annihilate undesirable dangling bonds that exist in the memory cells. In the peripheral circuit 61 where the transistors of address decoders and power lines for the memory cells are provided. These transistors must be hydrogen-annealed to improve their characteristics. However, hydrogen annealing is not necessary for the power lines. Since the etch stopper acts as a barrier to prevent intrusion of hydrogen molecules into the device, it is formed only in areas where the power lines of the peripheral circuit are provided. If the etch stopper were provided in the area of memory array, the diffusion of hydrogen molecules would be blocked. This results in a large leakage current in the transistor, causing the loss of energy stored in the capacitor.

What is claimed is:

1. A method of fabricating a semiconductor device, comprising the steps of:
    forming a first insulating layer;
    forming an etch stopper and a first contact plug in said first insulating layer wherein the etch stopper surrounds an end portion of the first contact plug, said first contact plug extending through the first insulating layer;
    forming a second insulating layer on the first insulating layer;

selectively etching the second insulating layer to form a throughhole extending to said end portion of the first contact plug; and forming a second contact plug in the throughhole.

2. A method of fabricating a semiconductor device, comprising the steps of:

forming a first insulating layer;

forming a first contact plug in said first insulating layer;

etching said first insulating layer until an end portion of the first contact plug is exposed to the outside;

forming an etch stop layer on said first insulating layer so that the exposed portion of the first contact plug is embedded in the etch stop layer;

anisotropically etching the etch stop layer so that a portion of the etch stop layer which surrounds the end portion of the first contact plug remains and said first insulating layer is exposed to the outside;

forming a second insulating layer on the exposed first insulating layer so that the end portion of the first contact plug and the surrounding etch stop layer portion are embedded in the second insulating layer;

polishing the second insulating layer until the end portion of the first contact plug, the surrounding portion of the etch stop layer and the second insulating layer present a flattened surface and the surrounding portion of the etch stop layer attains a desired width;

forming a third insulating layer on the flattened surface;

selectively etching the third layer to form a throughhole extending to said first contact plug; and forming a second contact plug in the throughhole.

3. A method of fabricating a semiconductor device, comprising the steps of;

forming a first, insulating layer;

forming a second, etch stop layer on the first insulating layer;

forming a third, insulating layer on the etch stop layer;

selectively etching said first, second and third layers to form a throughhole;

forming a first contact plug in said throughhole;

removing said third layer to expose an end portion of said first contact plug and said second layer;

forming a fourth, etch stop layer on the exposed second layer so that the end portion of the first contact plug is embedded in the fourth layer;

anisotropically etching the fourth layer so that a portion of the fourth layer which surrounds said end portion of the first contact plug remains and said first layer is exposed to the outside;

forming a fifth, insulating layer on the exposed third layer so that the end portion of the first contact plug and the surrounding fourth layer portion are embedded in the fifth layer;

polishing the fifth layer until the end portion of the first contact plug, the surrounding portion of the fourth layer and the fifth layer present a flattened surface and said surrounding portion attains a desired width;

forming a sixth, insulating layer on the flattened surface;

selectively etching the sixth layer to form a throughhole extending to said first contact plug; and forming a second contact plug in the throughhole.

4. A method of fabricating a semiconductor device, comprising the steps of:

forming a first insulating layer;

forming an etch stop layer in the first layer;

selectively etching an inner portion of said etch stop layer to form a throughhole in said first insulating layer so that an outer portion of the etch stop layer remains and surrounds an end portion of the throughhole;

forming a first contact plug in said throughhole;

polishing said first insulating layer until an end portion of the first contact plug, said outer portion of the etch stop layer and the first insulating layer form a flattened surface;

forming a second insulating layer on the flattened surface;

selectively etching the second insulating layer to form a throughhole extending to said first contact plug; and forming a second contact plug in the throughhole.

\* \* \* \* \*